United States Patent [19]

Matsui

[11] Patent Number: 4,916,668

[45] Date of Patent: Apr. 10, 1990

[54] INTERNAL SYNCHRONIZATION TYPE MOS SRAM WITH ADDRESS TRANSITION DETECTING CIRCUIT

[75] Inventor: Masataka Matsui, Tokyo, Japan

[73] Assignee: Kabushiki Kaisha Toshiba, Kawasaki, Japan

[21] Appl. No.: 330,048

[22] Filed: Mar. 29, 1989

[30] Foreign Application Priority Data

Mar. 31, 1988 [JP] Japan .................................. 63-76606

[51] Int. Cl.[4] .............................................. G11C 13/00
[52] U.S. Cl. ........................... 365/230.01; 365/230.06; 365/233
[58] Field of Search ...................... 365/230.01, 230.02, 365/230.03, 230.05, 230.06, 230.08, 233, 189.01, 189.05

[56] References Cited

U.S. PATENT DOCUMENTS 4,811,297 3/1989 Ogawa ........................... 365/189.12

Primary Examiner—Terrell W. Fears
Attorney, Agent, or Firm—Finnegan, Henderson, Farabow, Garrett and Dunner

[57] ABSTRACT

A memory cell array includes a plurality of static memory cells arranged in a matrix form and selectively controlled by means of word lines to output complementary memory data to paired bit lines. An address transition detecting circuit generates an address transition signal in the form of a monostable pulse having a constant length when detecting the transition of an address signal. A bit line initializing circuit initializes the potentials of the paired bit lines in synchronism with the address transition signal. A pulse width extension circuit sets the pulse width of the address transition signal generated from the address transition detecting circuit to be longer in the write mode than in the readout mode.

15 Claims, 6 Drawing Sheets

INTERNAL SYNCHRONIZATION TYPE MOS SRAM WITH ADDRESS TRANSITION DETECTING CIRCUIT

BACKGROUND OF THE INVENTION

1. Field of the Invention

This invention relates to a static random access memory (SRAM) and, more particularly, to an internal synchronization type MOS SRAM having an address transition detecting circuit (ATD).

2. DESCRIPTION OF THE RELATED ART

This type of SRAM is disclosed in, for example, 1985 IEEE International Solid-State Circuits Conference DIGEST OF TECHNICAL PAPERS pp. 64, 65 and 306 "A 17ns 64K CMOS RAM with a Schmitt Trigger Sense Amplifier" Kiyofumi Ochii et. al.

In the specification pertaining to the above SRAM, the time interval between the recovery of write enable signal $\overline{WE}$ from "0" level to "1" level (from the write state to the readout state) and application of a readout address for the next cycle or the address transition is defined as write recovery time $t_{WR}$. If the address is changed before write recovery time $t_{WR}$ has passed, data may be erroneously written in the next address. In general, write recovery time $t_{WR}$ is set to be greater than 0, and the address transition is inhibited in the write operation. However, the pulse width of address transition detection signal $\phi_{ATD}$ output from the ATD is set so as to attain the optimum readout operation, and the pulse is designed to terminate in synchronism with the rise of the word line potential. When the MOSFET is miniaturized, the time interval from the address transition to the rise of the word line potential is reduced according to the scaling rule. As a result of this, the pulse width of an equalizing pulse is reduced, and the operation margin for write recovery time $t_{WR}<0$ becomes extremely small, making it difficult to satisfy the specification of $t_{WR}=0$.

SUMMARY OF THE INVENTION

Accordingly, an object of this invention is to provide an SRAM capable of ensuring write recovery time $t_{WR}=0$ with a large operation margin.

According to one aspect of this invention, an SRAM is provided which comprises a memory cell array having static memory cells arranged in a matrix form; word lines arranged correspondingly to the rows of the memory cell array to select a memory cell row; bit line pairs arranged correspondingly to the columns of the memory cell array, data being transferred between the bit line pairs and the memory cell; an address input circuit for receiving an address signal; a row decoder for decoding a row address signal from the address input circuit and selectively driving the word line; a column decoder for decoding a column address signal from the address input circuit and selecting the bit line pair; an address transition detecting circuit for detecting the transition of the address signal to generate an address transition signal which is a monostable pulse of a constant length; a bit line initializing circuit controlled by the address transition detecting signal for initializing the potentials of the paired bit lines in synchronism with the address transition detecting signal; and a pulse width extension circuit for forming an address transition detecting signal having a longer period in a write mode than in a readout mode and supply the long-period address transition detecting signal to the bit line initializing circuit.

With the above construction, the address transition detecting signal is extended in the write mode by means of the pulse width extension circuit, and a bit line initializing signal having a longer pulse width than that in the readout mode can be generated. That is, the initializing time in the write mode becomes long to delay the inversion of the bit line potential, thus effectively preventing the erroneous data writing operation.

Therefore, an SRAM can be obtained in which the specification of write recovery time $t_{WR}=0$ can be achieved with a large operation margin.

DETAILED DESCRIPTION OF THE PREFERRED EMBODIMENTS

Figure 1:
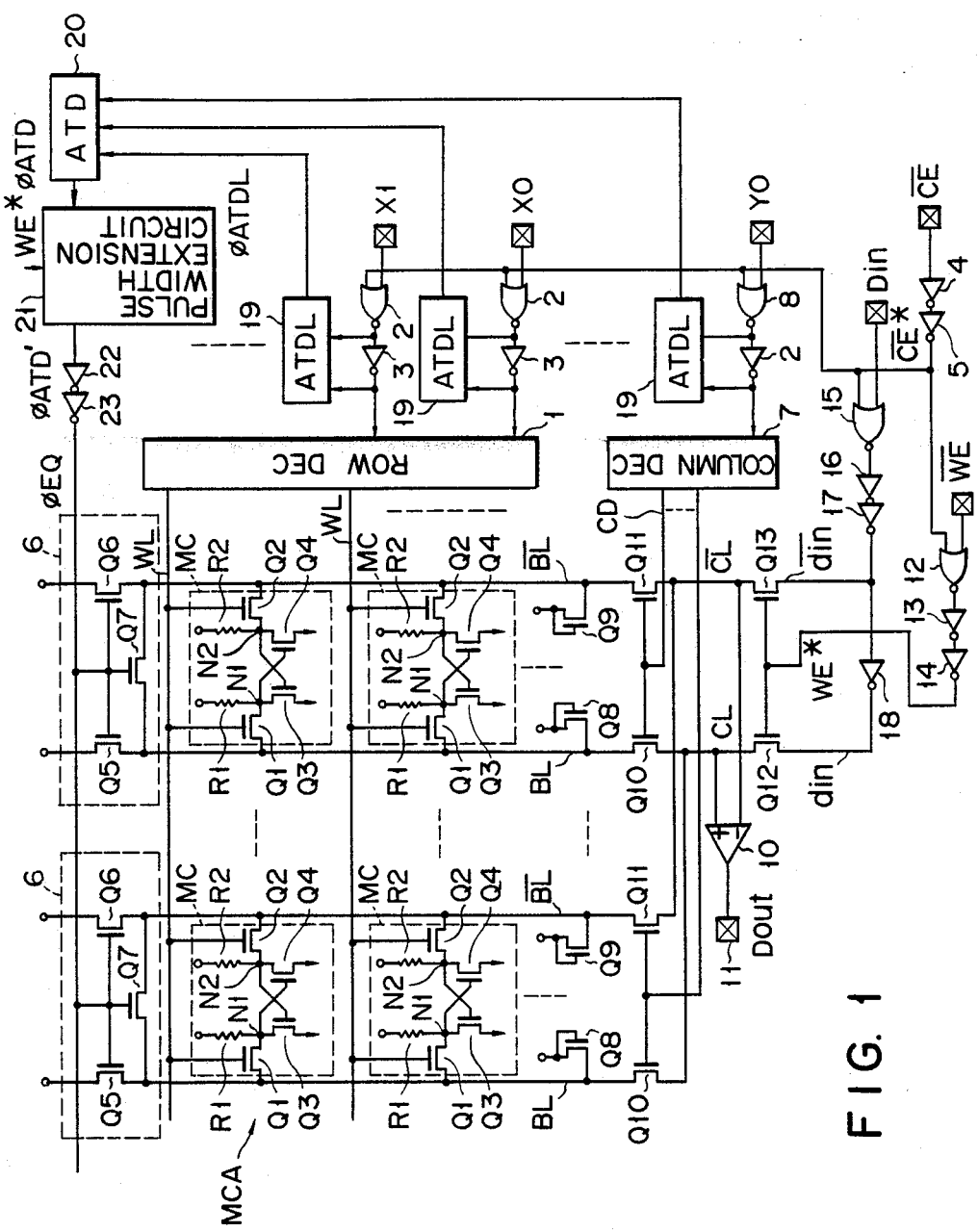
FIG. 1 is a block diagram showing the construction of an SRAM according to an embodiment of this invention.

FIG. 1 shows an example of an SRAM according to one embodiment of this invention. Memory cell array MCA is constructed by static memory cells MC arranged in a matrix form. Each of memory cells MC includes a flop-flop constructed by means of high-resistance load elements R1 and R2 and N-channel type MOS transistors Q3 and Q4; and transfer gate MOS transistors Q1 and Q2. High-resistance load elements R1 and R2 are connected at one end to a power source, and respectively connected at the other ends to one-ends of the current paths of MOS transistors Q3 and Q4. The other end of the current path of MOS transistor Q3 is grounded and the gate thereof is connected to a connection node (node N2) between high-resistance load element R2 and MOS transistor Q4. The other end of the current path of MOS transistor Q4 is grounded and the gate thereof is connected to a connection node (node N1) between high-resistance load element R1 and MOS transistor Q3. The current path of MOS transistor Q1 is connected between bit line BL and node N1, and the gate thereof is connected to word line WL. The current path of MOS transistor Q2 is connected between bit line $\overline{BL}$ and node N2, and the gate thereof is connected to word line WL. Complementary data are held on nodes N1 and N2, and transmitted to paired bit lines BL and $\overline{BL}$ when transfer gate MOS transistors Q1 and Q2 are turned on. Memory cell MC is called a four-transistor static memory cell. Such a memory cell MC may be formed by using MOS transistors as high-resistance load elements R1 and R2, and in this case, it is of six-transistor type. Each pair of bit lines BL and $\overline{BL}$ are arranged on a corresponding one of the columns of memory cells MC in memory cell array MCA. Each word line WL is arranged on a corresponding one of the rows of memory cell MC in memory cell array MCA. Word line WL is selectively driven by the output of row decoder 1. Row decoder 1 is supplied with row address signals X0, X1,—via NOR gate 2 and inverter 3. NOR gate 2 is supplied with chip enable signal $\overline{CE}$ as internal chip enable signal $\overline{CE}$ via inverters 4 and 5. When chip enable signal $\overline{CE}$ is at a low level, address signals X0, X1,—are supplied to row decoder 1 via NOR gate 2 and inverter 3. In contrast, when it is at a high level, supply of address signals X0, X1,—is inhibited. Bit lines BL and $\overline{BL}$ of each pair are connected at one end to a corresponding bit line precharging/equalizing circuit 6. Precharging/equalizing circuit 6 can function only as a precharging circuit or only as an equalizing circuit. Bit line precharging/equalizing circuit 6 includes bit line precharging MOS transistors Q5 and Q6 and bit line equalizing MOS transistor Q7. The gates of MOS transistors Q5 to Q7 are supplied with bit line equalizing signal $\phi_{EQ}$. The current path of bit line pull-up MOS transistor Q8 is connected between bit line BL and the power source, and the gate thereof is connected to the power source. The current path of bit line pull-up MOS transistor Q9 is connected between bit line $\overline{BL}$ and the power source, and the gate thereof is connected to the power source. MOS transistors Q8 and Q9 are normally kept in the conductive state to define potential difference $\Delta VBL$ between bit lines BL and $\overline{BL}$. The other end of each bit line $\overline{BL}$ is connected to one end of the current path of column transfer gate MOS transistor Q10. The other end of each bit line BL is connected to one end of the current path of column transfer gate MOS transistor Q11. The other ends of the current paths of MOS transistors Q10 and Q11 are respectively connected to common bit lines CL and $\overline{CL}$. The gates of MOS transistors Q10 and Q11 are connected together, and MOS transistors Q10 and Q11 are selectively rendered conductive in response to column selection signal CD supplied from column decoder 7. Column decoder 7 is supplied with column address signals Y0,—via NOR gate 8 and inverter 9. NOR gate 8 is supplied with internal chip enable signal $\overline{CE}$. When chip enable signal $\overline{CE}$ is at a low level, column address signals Y0, —are supplied to column decoder 7 via NOR gate 8 and inverter 9, and when it is at a high level, supply of column address signals Y0,—is inhibited. The input terminals of sense amplifier 10 are respectively connected to paired common bit lines CL and $\overline{CL}$. Paired common bit lines CL and $\overline{CL}$ are connected to one-ends of the current paths of write transfer gate MOS transistors Q12 and Q13. The conduction states of MOS transistors Q12 and Q13 are controlled in response to internal write enable signal WE* supplied to the gates thereof. Internal write enable signal WE* is formed based on chip enable signal $\overline{CE}$ and write enable signal $\overline{WE}$. One end of the input terminals of NOR gate 12 is supplied with write enable signal $\overline{WE}$, and the other input terminal thereof is supplied with chip enable signal $\overline{CE}$ via inverters 4 and 5. The output of NOR gate 12 is supplied as internal write enable signal WE* to the gates of MOS transistors Q12 and Q13 via inverters 13 and 14. The other end of the current path of MOS transistor Q12 is supplied with write-in data Din via NOR gate 15, inverters 16 to 18 and write-in data line din. The other end of the current path of MOS transistor Q13 is supplied with write-in data Din via NOR gate 15, inverters 16 and 17 and write-in data line $\overline{din}$. NOR gate 15 is supplied with internal chip enable signal $\overline{CE}$. When internal chip enable signal $\overline{CE}$ is at a low level, write-in data Din is supplied to the other end of the current path of MOS transistor Q12 via NOR gate 15, inverters 16 to 18 and write-in data line din, and to the other end of the current path of MOS transistor Q13 via NOR gate 15, inverters 16 and 17 and write-in data line $\overline{din}$. In contrast, when internal chip enable signal $\overline{CE}^*$ is at a high level, input of write-in data Din is inhibited.

The input and output terminals of inverters 3 and those of inverters 9 are connected to the input terminals of corresponding address transition detecting sections (ATDL) 19. Each address transition detecting section (ATDL) 19 detects change of row address signals X0, X1,—and column address signals Y0,—and supplies address transition detecting signal $\phi_{ATDL}$. Each address transition detecting signal $\phi_{ATDL}$ is supplied to address transition detecting circuit (ATD) 20. The logical sum of received address transition detecting signals $\phi_{ATDL}$ is derived by means of address transition detecting circuit (ATD) 20 and corresponding address transition signal $\phi_{ATD}$ is supplied as a monostable pulse. Address transition signal $\phi_{ATD}$ is supplied to pulse width extension circuit 21. Pulse width extension circuit 21 is controlled by internal write enable signal WE* to generate an address transition signal which is set to be longer in the write mode than in the readout mode. Output signal $\phi_{ATD'}$ of pulse width extension circuit 21 is supplied as bit line equalizing signal $\phi_{EQ}$ to the gates of MOS transistors Q5 to Q7 of bit line precharging/equalizing circuit 6 via inverters 22 and 23.

Now, the operation of the circuit with the above construction is explained. The readout operation is effected as follows. When chip enable signal $\overline{CE}$ is set to a low level, the circuit can be set ready for receiving row address signals X0, X1,—and column address signals Y0,—. Row address signals X0, X1,—are supplied to row decoder 1 via NOR gate 2 and inverter 3, and column address signals Y0,—are supplied to column decoder 7 via NOR gate 8 and inverter 9. Change of row address signals X0, X1,—and column address signals Y0,—is detected by means of address transition detecting section 19. When change of the address signals is thus detected by means of address transition detecting section 19, address transition detecting signal $\phi_{ATDL}$ is output. Then, the logical sum of address transition detecting signals $\phi_{ATDL}$ is derived by means of address transition detecting circuit 20, and address transition signal $\phi_{ATD}$ is output. Signal $\phi_{ATD}$ is supplied to bit line precharging/equalizing circuit 6 via pulse width extension circuit 21, and inverters 22 and 23. In the readout mode, the operation of extending address transition signal $\phi_{ATD}$ by means of pulse width extension circuit 21 is not effected. When bit line equalizing signal $\phi_{EQ}$ is supplied to the gates of MOS transistors Q5 to Q7, the MOS transistors are turned on and the potentials of paired bit lines BL and $\overline{BL}$ are set to the same potential level in synchronism with the change of the address signals. As a result, data corresponding to the former address can be reset at a high speed.

Row address signals X0, X1,—are decoded by means of row decoder 1 to select one of word lines WL while the equalizing operation is effected. The potential of selected word line WL is set to a high level, causing transfer gate MOS transistors Q1 and Q2 of memory cells MC connected to the selected word line to be turned on. As a result, complementary data held on nodes N1 and N2 are read out and supplied to paired bit lines BL and $\overline{BL}$. At this time, column address signals Y0,—are decoded by means of column decoder 7 and column selection signal CD corresponding to the selected column is set to a high level. As a result, column transfer gate MOS transistors Q10 and Q11 on the selected column are turned on, thereby connecting a selected pair of bit lines BL and $\overline{BL}$ to a pair of common bit lines CL and $\overline{CL}$. Data read out and supplied to a pair of common bit lines CL and $\overline{CL}$ is amplified by means of sense amplifier 10. The amplified signal of sense amplifier 10 is output as output signal Dout from output terminal 11.

Figure 2:
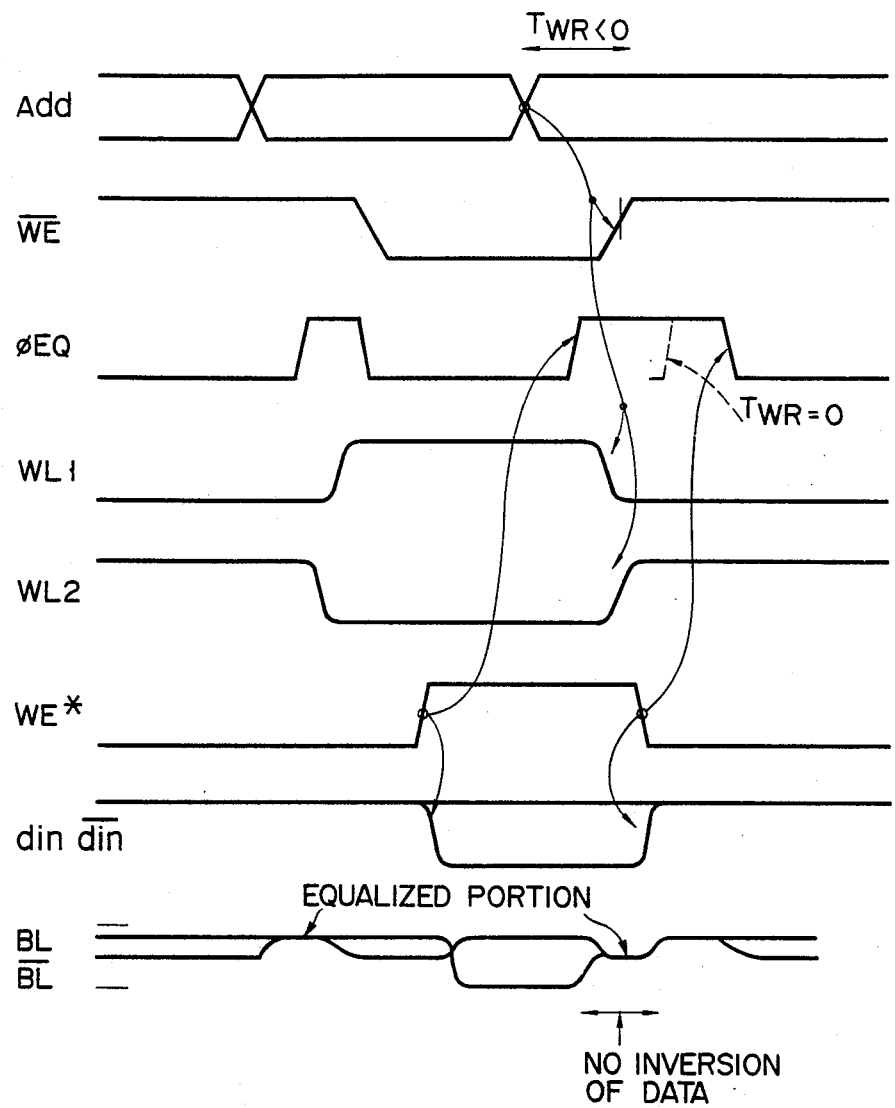
FIG. 2 is a timing chart for illustrating the write operation of the circuit shown in FIG. 1.

Next, the write-in operation is explained with reference to the timing chart of FIG. 2. When chip enable signal $\overline{CE}$ is set to a low level, the memory device is set into the enable state. If, in this condition, address signal Add is input and write enable signal $\overline{WE}$ is set to a low level, the write mode is set. Internal write enable signal WE* is set to a high level according to chip enable signal $\overline{CE}$ and write enable signal $\overline{WE}$. When the transition of address signal Add (row address signals X0, X1,—and column address signals Y0,—) occurs, the transition is detected by means of address transition detecting sections 19 and address transition detecting signals $\phi_{ATDL}$ are output. The logical sum of address transition detecting signals $\phi_{ATDL}$ is derived by means of address transition detecting circuit 20 and address transition signal $\phi_{ATD}$ is output therefrom. Signal $\phi_{ATD}$ is extended by means of pulse width extension circuit 21, and signal $\phi_{ATD}$, is output. The waveform of output signal $\phi_{ATD}$, of pulse width extension circuit 21 is shaped by means of inverters 22 and 23, and then output signal $\phi_{ATD}$, is supplied as equalizing signal $\phi_{EQ}$ to bit line precharging/equalizing circuit 6. As a result, MOS transistors Q5 to Q7 of bit line precharging/equalizing circuit 6 are turned on to equalize the potentials of paired bit lines BL and $\overline{BL}$. The equalizing period is set to be longer by means of pulse width extension circuit 21 than in the readout mode.

In the same manner as in the readout mode, one of memory cells MC is selected based on the outputs of row decoder 1 and column decoder 7 while the equalizing operation for paired bit lines BL and $\overline{BL}$ is effected. Chip enable signal $\overline{CE}$ and write enable signal $\overline{WE}$ of low level cause internal write enable signal WE* to be set to a high level. As a result, MOS transistors Q12 and Q13 are turned on, thereby connecting paired write data lines din and $\overline{din}$ to paired bit lines BL and $\overline{BL}$. Write-in data Din is supplied to write data line din via NOR gate 15 and inverters 16 to 18 and to write data line $\overline{din}$ via NOR gate 15 and inverters 16 and 17. Further, write-in data Din is supplied from write data lines din and $\overline{din}$ to paired bit lines BL and $\overline{BL}$ via MOS transistors Q12 and Q13, paired common bit lines CL and $\overline{CL}$ and MOS transistors Q10 and Q11 which are selected and set in the conductive state by means of column decoder 7. Then, the potentials of bit lines BL and $\overline{BL}$ are supplied to storage nodes N1 and N2 of selected memory cell MC and held on the nodes.

The write operation is completed by resetting write enable signal $\overline{WE}$ to a high level. As a result, internal write enable signal WE* is set to a low level (inactive), causing MOS transistors Q12 and Q13 to be turned off. Therefore, write data lines $\overline{din}$ and din are separated from paired common bit lines CL and $\overline{CL}$ to set the readout mode.

With the above construction, the following advantages can be obtained in comparison with the conventional technique in which the pulse width of bit line equalizing pulse is kept constant. That is, write recovery time $t_{WR}$ which is determined by the speed of change of the address in the readout mode can be set to be longer by $\Delta T$ by which bit line equalizing pulse $\phi_{EQ}$ is extended. Further, since the pulse width of pulse $\phi_{EQ}$ in the readout mode can be determined independently of that in the write mode, the readout speed will not be influenced.

Figure 3:
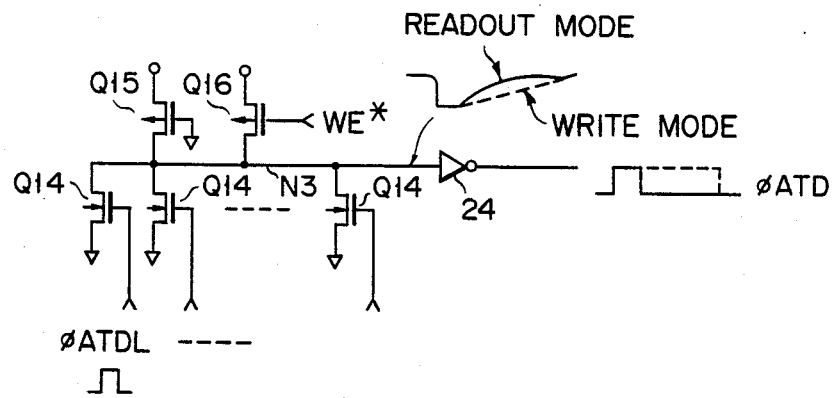
FIGS. 3 to 6 are circuit diagrams showing the detail constructions of ATD and pulse width extension circuit in the circuit of FIG. 1.

FIG. 3 shows the construction of address transition detecting circuit 20 and pulse width extension circuit 21 of the circuit shown in FIG. 1. Address transition detecting signals $\phi_{ATDL}$ from address transition detecting sections 19 are supplied to the gates of P-channel MOS transistors Q14. One end of the current path of each MOS transistor Q14 is grounded and the other ends of the current paths thereof are connected together. The current paths of P-channel MOS transistors Q15 and Q16 acting as loads are connected in parallel between common connection node N3 at which the other ends of the current paths of MOS transistors Q14 are connected together and the power source. The gate of MOS transistor Q15 is grounded and MOS transistor Q15 is normally kept conductive. The gate of MOS transistor Q16 is supplied with internal write enable signal WE*. The input terminal of inverter 24 is connected to node N3 and address transition signal $\phi_{ATD}$ is output from the output terminal of inverter 24.

With the above construction, internal write enable signal WE* is set at a low level in the readout mode and at a high level in the write mode. Therefore, MOS transistor Q16 is set conductive in the readout mode and nonconductive in the write mode. When, in the readout mode, the transition of row and column address signals X0, X1,—and Y0,—is detected by means of address transition detecting section 19, address transition detecting signal $\phi_{ATDL}$ becomes high and at least one of MOS transistors Q14 is set conductive. As a result, the potential of node N3 is set to a low level, and output $\phi_{ATD}$ of inverter 24 becomes high. When signal $\phi_{ATDL}$ is set to a low level, all the MOS transistors Q14 are turned off so that the potential of node N3 may be raised by the precharging operation through MOS transistors Q15 and Q16. When the potential of node N3 has exceeded the threshold value of inverter 24, output $\phi_{ATD}$ of inverter 24 is set to a low level.

In the write mode, when the transition of row and column address signals X0, X1,—and Y0,—is detected by means of address transition detecting section 19, address transition detecting signal $\phi_{ATDL}$ becomes high and at least one of MOS transistors Q14 is set conductive. As a result, the potential of node N3 is set to a low level, and output $\phi_{ATD}$ of inverter 24 becomes high. When signal $\phi_{ATDL}$ is set to a low level, all the MOS transistors Q14 are turned off so that the potential of node N3 may be slowly raised by the precharging operation through MOS transistor Q15. When the potential of node N3 has exceeded the threshold value of inverter 24, output $\phi_{ATD}$ of inverter 24 is set to a low level.

In this way, node N3 is precharged through two MOS transistors Q15 and Q16 in the readout mode, and precharged through one transistor Q15 in the write mode. Therefore, the pulse width of address transition signal $\phi_{ATD}$ is set to be longer in the write mode than in the readout mode.

Figure 4:
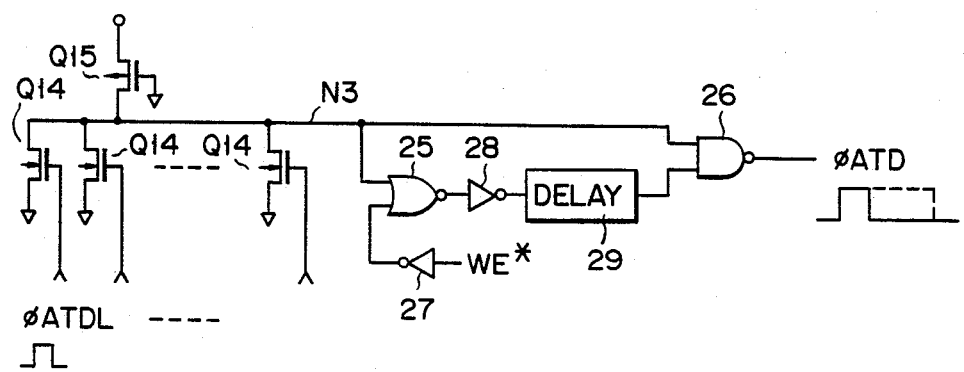

FIG. 4 shows other constructions of address transition detecting circuit 20 and pulse width extension circuit 21 in the circuit of FIG. 1. Address transition detecting signals $\phi_{ATDL}$ from address transition detecting sections 19 are supplied to the gates of P-channel MOS transistors Q14. One end of the current path of each MOS transistor Q14 is grounded and the other ends of the current paths thereof are connected together. The current paths of P-channel MOS transistors Q15 and Q16 acting as loads are connected in parallel between common connection node N3 at which the other ends of the current paths of MOS transistors Q14 are connected together and the power source. The gate of MOS transistor Q15 is grounded and MOS transistor Q15 is normally kept conductive. One input terminal of NOR gate 25 and one input terminal of NAND gate 26 are connected to node N3. The other input terminal of NOR gate 25 is supplied with internal write enable signal WE* via inverter 27. The output terminal of NOR gate 25 is connected to the input terminal of inverter 28 whose output terminal is connected to delay circuit 29. The output terminal of delay circuit 29 is connected to the other input terminal of NAND gate 26, and address transition signal $\phi_{ATD}$ is output from the output terminal of NAND gate 26.

With the above construction, when the transition of the address signal is not detected, all the MOS transistors Q14 are kept in the off condition since address transition detecting signal $\phi_{ATDL}$ is set at a low level. Therefore, at this time, node N3 is precharged through all the MOS transistors Q15 and is kept at a high level. The output of NAND gate 32 is set at a low level irrespective of the level of internal write enable signal WE*. When, in the readout mode, the transition of row and column address signals X0, X1,—and Y0,—is detected by means of address transition detecting sections 19, address transition detecting signal $\phi_{ATDL}$ becomes high and at least one of MOS transistors Q14 is set conductive. As a result, the potential of node N3 set to a low level. When signal $\phi_{ATDL}$ is set to a low level, all the MOS transistors Q14 are turned off so that the potential of node N3 may be raised by the precharging operation through MOS transistor Q15 and set to a high level. As a result the output of NAND gate 26 is set to a high level. When signal $\phi_{ATDL}$ is set to a low level, all the MOS transistors Q14 are turned off and the potential of node N3 is raised, causing the output of NAND gate 26 to be set to a low level. Since, in the readout mode, internal write enable signal WE* is set at a low level, it has no relation with the above operation.

In the write mode, when the transition of row and column address signals X0, X1,—and Y0,—is detected by means of address transition detecting sections 19, address transition detection signal $\phi_{ATDL}$ becomes high and at least one of MOS transistors Q14 is set conductive. As a result, the potential of node N3 is set to a low level, and the output of NAND gate 26 is set to a high level. When signal $\phi_{ATLD}$ is set to a low level, all the MOS transistors Q14 are turned off so that the potential of node N3 is raised to a high level by the precharging operation through MOS transistor Q15. Since, at this time, internal write enable signal WE* is at a low level, the output of NAND gate 26 will not be set to a high level. The output of NAND gate 26 is set to a low level after a preset delay time determined by delay circuit 29 has elapsed.

With the construction of FIG. 4, the pulse width of address transition signal $\phi_{ATD}$ is set to be longer in the write mode than in the readout mode in the same manner as in the circuit of FIG. 3.

Figure 5:
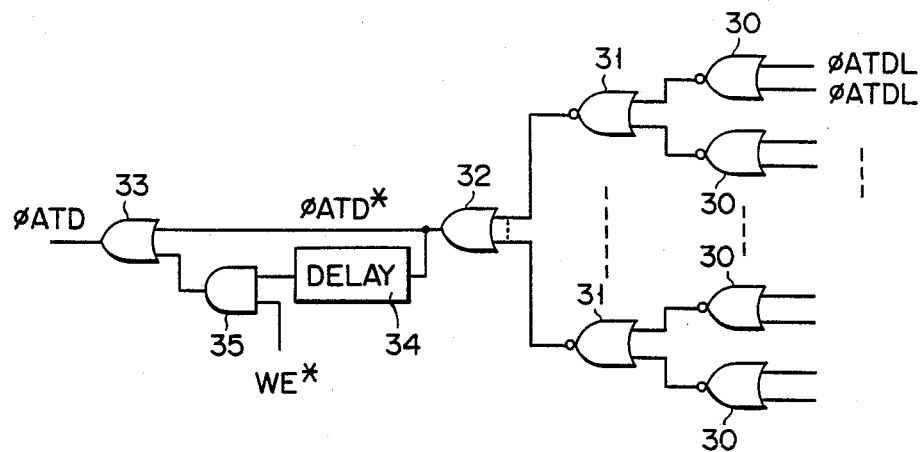

FIG. 5 shows still other constructions of address transition detecting circuit 20 and pulse width extension circuit 21 in the circuit of FIG. 1. The two input terminals of each of 2-input NOR gates 30 are supplied with corresponding two of address transition detecting signals $\phi_{ATDL}$ from address transition detecting sections 19. The two input terminals of each 2-input NOR gate 31 are supplied with corresponding two outputs of NOR gates 30. The outputs of NOR gates 31 are supplied to OR gate 32. NOR gates 30 and 31 and OR gate 32 constitute an AND-NOR type ATD. The output of OR gate 32 is supplied to one input terminal of OR gate 33 and delay circuit 34. The output of delay circuit 33 and internal write enable signal WE* are supplied to AND gate 35 whose output is in turn supplied to the other input terminal of OR gate 33. Then, OR gate 33 produces address transition signal $\phi_{ATD}$.

With the above construction, since internal write signal WE* is at a low level in the readout mode the output of AND gate 35 is always set at a low level and therefore AND gate 35 and delay circuit 34 will give no influence on the operation described above. When address transition detecting signal $\phi_{ATDL}$ is generated. internal address transition signal $\phi_{ATD}*$ is formed by means of the AND-NOR type ATD including NOR gates 31 and OR gate 32, and address transition signal $\phi_{ATD}$ is output from OR gate 33.

In contrast, in the write mode, address transition signal $\phi_{ATD}$ is formed in the same manner as in the readout mode. Since, at this time, internal write enable signal WE* is at a high level, the output of OR gate 32 is supplied to the other input terminal of OR gate 33 via delay circuit 34 and AND gate 35. Therefore, output signal $\phi_{ATD}$ of OR gate 33 is set to a low level when a delay time set by delay circuit 34 has elapsed after output signal $\phi_{ATD}*$ of OR gate 32 has been set to a low level.

Like the circuits of FIGS. 3 and 4, with the construction of FIG. 5, the pulse width of address transition signal $\phi_{ATD}$ is set to be longer in the write mode than in the readout mode.

Figure 6:
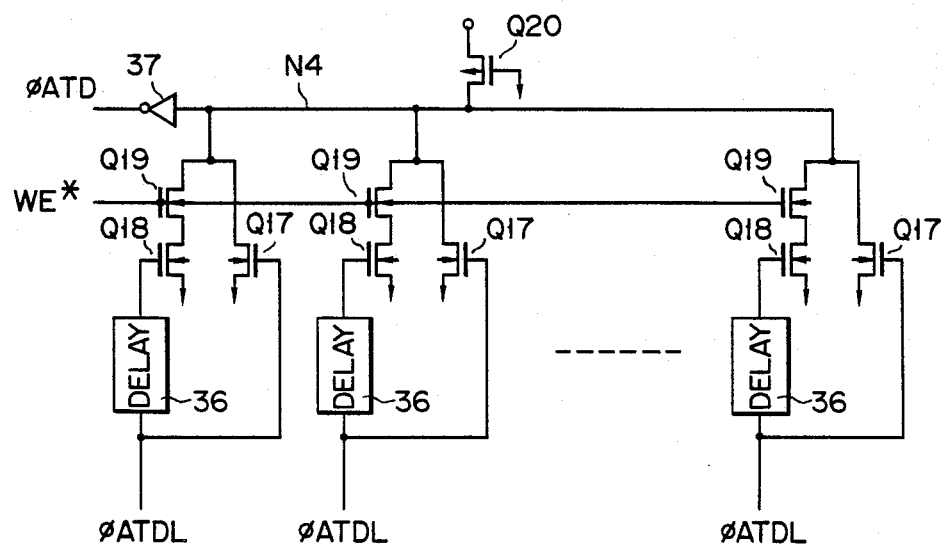

FIG. 6 shows other constructions of address transition detecting circuit 20 and pulse width extension circuit 21 in the circuit of FIG. 1. Address transition detecting signals $\phi_{ATDL}$ from address transition detecting sections 19 are supplied to the gates of N-channel MOS transistors Q17. Address transition detecting signals $\phi_{ATDL}$ are supplied to the gates of N-channel MOS transistors Q18 via respective delay circuits 36. One-ends of the current paths of MOS transistors Q17 and Q18 are grounded. The other end of the current path of each of MOS transistors Q18 is connected to one end of the current path of a corresponding one of MOS transistors Q19 whose conduction state is controlled by internal write enable signal WE*. The other ends of the current paths of MOS transistors Q17 and the other ends of the current paths of MOS transistors Q19 are connected together. The current path of P-channel MOS transistor Q20 is connected between commonly connected node N4 and the power source. The gate of MOS transistor Q20 is grounded to always keep the MOS transistor in the conductive state. Address transition signals $\phi_{ATD}$ is output from inverter 37 whose input terminal is connected to node N4.

With the above construction, since internal write enable signal WE* is at a low level in the readout mode, each MOS transistor Q19 is set in the nonconductive state, and MOS transistors Q18 and Q19 and delay circuits 36 have no influence on the operation of the circuit. When address transition detecting signals $\phi_{ATDL}$ are supplied to the gates of respective MOS transistors Q17, at least one of MOS transistors Q17 is turned on, setting the potential of node N4 to a low level. As a result, address transition signal $\phi_{ATD}$ becomes high. When address transition detecting signals $\phi_{ATDL}$ are set to a low level, all the MOS transistors Q17 are turned off, setting the potential of node N4 to a high level. As a result, address transition signal $\phi_{ATD}$ becomes low.

In contrast, since internal write enable signal WE* is at a high level in the write mode, each MOS transistor Q19 is set in the conductive state. When address transition detecting signals $\phi_{ATDL}$ are supplied to the gates of respective MOS transistors Q17, at least one of MOS transistors Q17 is turned on. At this time, address transition signals $\phi_{ATD}$ supplied to the gates of MOS transistors Q18 are delayed by means of delay circuits 36, and therefore MOS transistors Q18 are still kept nonconductive. MOS transistor Q17 set into the conductive state causes the potential of node N4 to be set to a low level. As a result, address transition signal $\phi_{ATD}$ is set to a high level. When address transition detecting signal $\phi_{ATDL}$ is set to a low level, all the MOS transistors Q17 are turned off. However, since MOS transistor Q18 is turned on with a delay time, node N4 is discharged via MOS transistors Q19 and Q18, thus delaying the rise of the potential of node N4 by a delay time determined by delay circuit 36. After the delay time caused by delay circuit 36, MOS transistors Q18 are all turned off and the potential of node N4 rises, causing address transition signal $\phi_{ATD}$ to be set to a low level.

With the construction of FIG. 6, the pulse width of address transition signal $\phi_{ATD}$ is set to be longer in the write mode than in the readout mode in the same manner as in the circuits of FIGS. 3 to 5.

What is claimed is:

1. A static random access memory comprising:
   a memory cell array having static memory cells arranged in a matrix form;
   word lines arranged correspondingly to the rows of said memory cell array, for selecting the memory cell row;
   bit line pairs arranged correspondingly to the columns of said memory cell array, data being transferred between said bit line pairs and said memory cell;
   address input means for receiving an address signal;
   row decoder means for decoding a row address signal from said address input means and selectively driving the word line;
   column decoder means for decoding a column address signal from said address input means and selecting the bit line pair;
   address transition detecting means for detecting the transition of the address signal to generate an address transition signal which is a monostable pulse of a constant length;
   bit line initializing means controlled by the address transition detecting signal for initializing the potentials of said paired bit lines in synchronism with the address transition signal; and
   pulse width extension means for forming in a write mode an address transition signal having a longer period than that in a readout mode and supply the long-period address transition signal to said bit line initializing means.

2. A static random access memory according to claim 1, wherein said address transition detecting means and said pulse extension means include a plurality of address transition detecting sections for detecting the transition of an address signal; a plurality of MOS transistors of a first conductivity type whose current paths are connected at one end commonly to a first potential supplying source and connected together at the other end, and whose gates are supplied with respective output signals of said address transition detecting sections; a load element being connected between the other commonly connected ends of said MOS transistors and a second potential supplying source; a second MOS transistor of a second conductivity type whose current paths are connected between the other commonly connected ends of said MOS transistors and said second potential supplying source and whose conduction state is controlled by a write enable signal, said second MOS transistor being set in the conductive state in the readout mode and in the nonconductive state in the write mode; and logic means for binary-coding the potential of the other commonly connected ends of said MOS transistors using a preset threshold voltage to form an address transition signal.

3. A static random access memory according to claim 2, wherein said logic means includes an inverter.

4. A static random access memory according to claim 1, wherein said address transition detecting means and said pulse extension means include a plurality of address transition detecting sections for detecting the transition of an address signal; a plurality of MOS transistors of a first conductivity type whose current paths are connected at one end commonly to a first potential supplying source and connected together at the other end, and whose gates are supplied with respective output signals of said address transition detecting sections; a load element being connected between the other commonly connected ends of said MOS transistors and a second potential supplying source; a NOR gate having one input terminal connected to the other commonly connected ends of said MOS transistors and the other input terminal connected to receive a signal which is set at a high level in the readout mode and at a low level in the write mode; delay means for delaying a signal in the inverted form of the output signal of said NOR gate; and a NAND gate having one input terminal connected to the other commonly connected ends of said MOS transistors and the other input terminal connected to the output terminal of said delay means.

5. A static random access memory according to claim 1, wherein said address transition detecting means and said pulse extension means include a plurality of address transition detecting sections for detecting the transition of an address signal; AND-OR type address transition detecting circuit supplied with an output signal of each of said address transition detecting sections; delay means for delaying an output signal of said address transition detecting circuit; first logic means for deriving the logical product of an output signal of said delay means and a signal which is set at a low level in the readout mode and at a low level in the write mode; and second logic means for deriving a logic sum of the output signal of said address transition detecting circuit and an output signal of said first logic means.

6. A static random access memory according to claim 5, wherein said AND-OR type address transition detecting circuit includes a first group of two-input NOR gates each supplied with the output signals of corresponding two of said address transition detecting sections; a second group of two-input NOR gates each supplied with corresponding two output signals of said first group of two-input NOR gates; and an OR gate supplied with output signals of said second group of two-input NOR gates.

7. A static random access memory according to claim 5, wherein said first logic means includes an AND gate.

8. A static random access memory according to claim 5, wherein said second logic means includes an OR gate.

9. A static random access memory according to claim 1, wherein said address transition detecting means and said pulse extension means include a plurality of address transition detecting sections for detecting the transition of an address signal; a first group of MOS transistors of a first conductivity type whose current paths are connected at one end commonly to a first potential supplying source and whose gates are supplied with respective output signals of said address transition detecting sections; a second group of MOS transistors of the first conductivity type whose current paths are connected at one end to said first potential supplying means and whose gates are supplied with output signals of said address transition detecting sections with a delay time; a third group of MOS transistors whose current paths are connected at one end to the other ends of the respective current paths of said second group of MOS transistors and connected at the other end to the other ends of the respective current paths of said first group of MOS transistors and whose gates are supplied with a signal which is set at a high in the readout mode and at a low level in the write mode; a load element being connected between a connection node of the other commonly connected ends of said first and third groups of MOS transistors and a second potential supplying source; and logic means for binary-coding the potential of said connection node of the other commonly connected ends of said first and third MOS transistors using a preset threshold voltage to form an address transition signal.

10. A static random access memory according to claim 9, wherein said logic means includes an inverter.

11. A static random access memory according to claim 1, wherein said bit line initializing means has at least one precharging circuit including first and second MOS transistors whose current paths are connected between said paired bit lines and said power source and whose conduction states are controlled by the output signal of said pulse width extension means.

12. A static random access memory according to claim 1, wherein said bit line initializing means has at least one equalizing circuit including a MOS transistor whose current path is connected between said pared bit lines and whose conduction state is controlled by the output signal of said pulse width extension means.

13. A static random access memory according to claim 1, wherein said bit line initializing means has at least one initializing circuit including first and second MOS transistors whose current paths are connected between said paired bit lines and said power source and whose conduction states are controlled by the output signal of said pulse width extension means; and a third MOS transistor whose current path is connected between said paired bit lines and whose conduction state is controlled by the output signal of said pulse width extension means.

14. A static random access memory according to claim 1, further comprising waveform shaping means for wave-shaping the output signal of said pulse width extension means and supplying the same to said bit line initializing means.

15. A static random access memory according to claim 14, wherein said waveform shaping means includes a first inverter supplied with the output signal of said pulse width extension means and a second inverter supplied with an output signal of said first inverter.

* * * * *